(12) United States Patent
Powell

(10) Patent No.: US 9,328,408 B2
(45) Date of Patent: May 3, 2016

(54) SYSTEM AND METHOD FOR DEPOSITING A MATERIAL ON A SUBSTRATE

(75) Inventor: Rick C. Powell, Ann Arbor, MI (US)

(73) Assignee: First Solar, Inc., Perrysburg, OH (US)

(*) Notice: Subject to any disclaimer, the term of this patent is extended or adjusted under 35 U.S.C. 154(b) by 1475 days.

(21) Appl. No.: 12/320,060

(22) Filed: Jan. 15, 2009

(65) Prior Publication Data
US 2009/0246940 A1    Oct. 1, 2009

Related U.S. Application Data

(60) Provisional application No. 61/021,148, filed on Jan. 15, 2008.

(51) Int. Cl.
*C23C 14/22* (2006.01)
*C23C 14/32* (2006.01)
*H01J 37/32* (2006.01)

(52) U.S. Cl.
CPC ........... *C23C 14/32* (2013.01); *H01J 37/32009* (2013.01); *H01J 37/3255* (2013.01); *H01J 37/32541* (2013.01)

(58) Field of Classification Search
None
See application file for complete search history.

(56) References Cited

U.S. PATENT DOCUMENTS

| | | | |
|---|---|---|---|
| 4,250,004 A | 2/1981 | Miles et al. | |
| 5,013,578 A | 5/1991 | Brown et al. | |
| 5,022,930 A | 6/1991 | Ackerman et al. | |
| 5,149,488 A * | 9/1992 | Dickson | 266/242 |
| 5,368,897 A * | 11/1994 | Kurihara et al. | 427/450 |
| 5,580,500 A | 12/1996 | Muramatsu et al. | |
| 5,680,014 A | 10/1997 | Miyamoto et al. | |
| 6,037,241 A | 3/2000 | Powell et al. | |
| 6,139,697 A | 10/2000 | Chen et al. | |
| 2003/0106643 A1 * | 6/2003 | Tabuchi et al. | 156/345.35 |
| 2004/0046497 A1 | 3/2004 | Schaepkens et al. | |
| 2005/0133160 A1 * | 6/2005 | Kennedy et al. | 156/345.34 |
| 2005/0158891 A1 | 7/2005 | Barth et al. | |
| 2006/0075969 A1 * | 4/2006 | Fischer | 118/725 |
| 2006/0236937 A1 * | 10/2006 | Powell et al. | 118/726 |

OTHER PUBLICATIONS

International Preliminary Report on Patentability, Mar. 2009.

* cited by examiner

*Primary Examiner* — Charles Capozzi
(74) *Attorney, Agent, or Firm* — Blank Rome LLP

(57) ABSTRACT

An apparatus for depositing a film on a substrate which includes a distributor for providing a semiconductor coating on a substrate, a power source for heating the distributor and a plasma source positioned proximate to a distributor for exposing the semiconductor coating to a plasma prior to deposition on the substrate.

28 Claims, 4 Drawing Sheets

# SYSTEM AND METHOD FOR DEPOSITING A MATERIAL ON A SUBSTRATE

CLAIM FOR PRIORITY

This application claims priority under 35 U.S.C. §119(e) to Provisional U.S. Patent Application Ser. No. 61/021,148 filed on Jan. 15, 2008, which is hereby incorporated by reference.

TECHNICAL FIELD

The present invention relates to photovoltaic device production.

BACKGROUND

In the manufacture of a photovoltaic device, semiconductor material is deposited on a substrate. This may be accomplished by vaporizing the semiconductor and directing the vaporized semiconductor toward a substrate surface, such that the vaporized semiconductor condenses and is deposited on the substrate, forming a solid semiconductor film.

SUMMARY

A deposition system can include a distributor configured to provide a semiconductor coating on a substrate, a first power source configured to heat the distributor, and a plasma source positioned proximate to the distributor, the plasma source including an electrode configured to drive the plasma source, wherein the electrode is electrically independent from the first power source.

In some circumstances, the system or method can include an additional electrode configured to bias the plasma source with respect to the substrate. An electrode can be a backcap over a distributor. An electrode can include a non-metallic material, such as carbon, for example. In one example, an electrode can include graphite. An electrode can be a spacer. An electrode can be a backcap. A spacer can be a graphite spacer. A backcap can be a graphite backcap.

In other circumstances, a distributor can include a pair of sheath tubes including a first sheath tube and a second sheath tube. An electrode can be a spacer between a first sheath tube and a second sheath tube. An electrode can be a backcap over a first sheath tube and a second sheath tube.

In other circumstances, a distributor can include a pair of sheath tubes including a first sheath tube and a second sheath tube. An electrode can be a conductor parallel to a first sheath tube and a second sheath tube. An electrode can be a backcap over a first sheath tube and a second sheath tube.

In other circumstances, a distributor can be a pair of sheath tubes including a first sheath tube and a second sheath tube, and the plasma source can include three graphite components electrically isolated from one another. The first graphite component can be a first spacer separating the first sheath tube from the second sheath tube. The second graphite component can be a second spacer separating the first sheath tube from the second sheath tube. The third graphite component can be a backcap over the first sheath tube and the second sheath tube. In other circumstances, a system can further include an insulator between a backcap and each of the spacers.

In some circumstances, a distributor can include at least one distribution hole configured to provide a semiconductor coating on a substrate. A plasma source can be driven by direct current. A plasma source can be driven by alternating current. A plasma source can be driven by pulsed direct current. A plasma source can be driven by radiofrequency electrical excitation.

In certain circumstances, a system or method can include a conveyor configured to transport the substrate past the distributor. A distributor can be positioned within a deposition chamber, the deposition chamber including an entry through which the substrates to be coated are introduced into the deposition chamber; and the deposition chamber including an exit through which the coated substrates leave the deposition chamber. A distributor can include a ceramic tube. A distributor can include a mullite tube. A distributor can include a ceramic sheath tube.

In other circumstances, a system or method can include a permeable heater positioned within the distributor. A plasma source can be configured to generate plasma in a region less than 10 centimeters from a substrate. A plasma source can be configured to generate plasma in a region less than 7 centimeters from a substrate. A plasma source can be configured to generate plasma in a region less than 5 centimeters from a substrate. A plasma source can be configured to generate plasma in a region less than 2 centimeters from a substrate.

A method of depositing a material on a substrate can include providing a first power source configured to heat a distributor, the distributor configured to deposit a semiconductor coating on a substrate, providing a plasma source including an electrode that is electrically independent from the first power source, and exciting a plasma within a volume proximate to the distributor and proximate to the substrate.

The details of one or more embodiments are set forth in the accompanying drawings and the description below. Other features, objects, and advantages will be apparent from the description and drawings, and from the claims.

DETAILED DESCRIPTION

In general, a deposition system can include a distributor configured to provide a semiconductor coating on a substrate, a first power source configured to drive a distributor, and a plasma source positioned proximate to the distributor, the plasma source including an electrode configured to drive the plasma source, wherein the electrode is electrically independent from the first power source. In some circumstances, a system or method can include an additional electrode configured to bias the plasma source with respect to the substrate. An electrode can be a conductor parallel to a distributor. An electrode can be a backcap over a distributor. An electrode can include a non-metallic material, such as carbon, for example. An electrode can include graphite.

A distributor is an assembly, including a feed tube, a sheath tube, or both, configured to deposit a material on a substrate through one or more openings. A distributor can include a pair of sheath tubes including a first sheath tube and a second sheath tube. A sheath tube can provide a spatial distribution of vapor through a plurality of holes. A sheath tube can at least partially surround a feed tube such as a powder injection tube. A heater can be a tube provided to sheath a feed tube. A heater can, in turn, be sheathed by a sheath tube, thereby resulting in three substantially concentric tubes. The heater can be a permeable heater, which allows the material from a feeder tube to permeate through the heater and into a space between the heater and a sheath tube.

Figure 1:
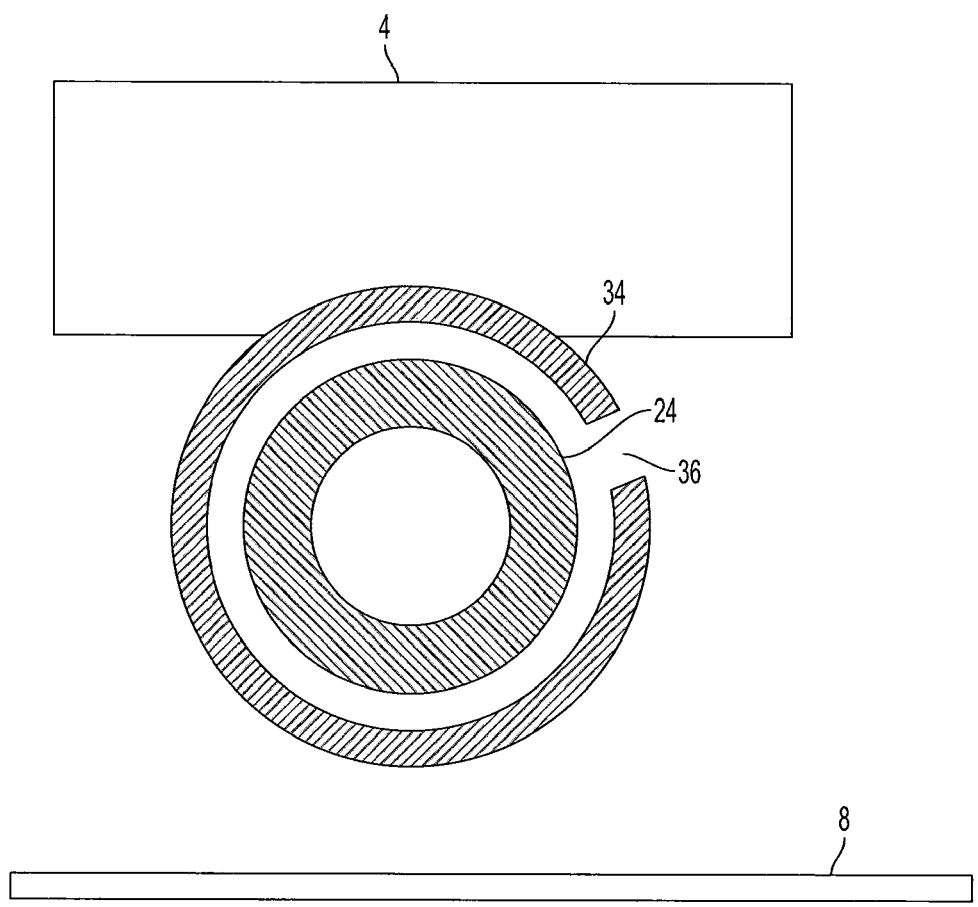
FIG. 1 is a schematic of system including a plasma source.
Figure 1A:
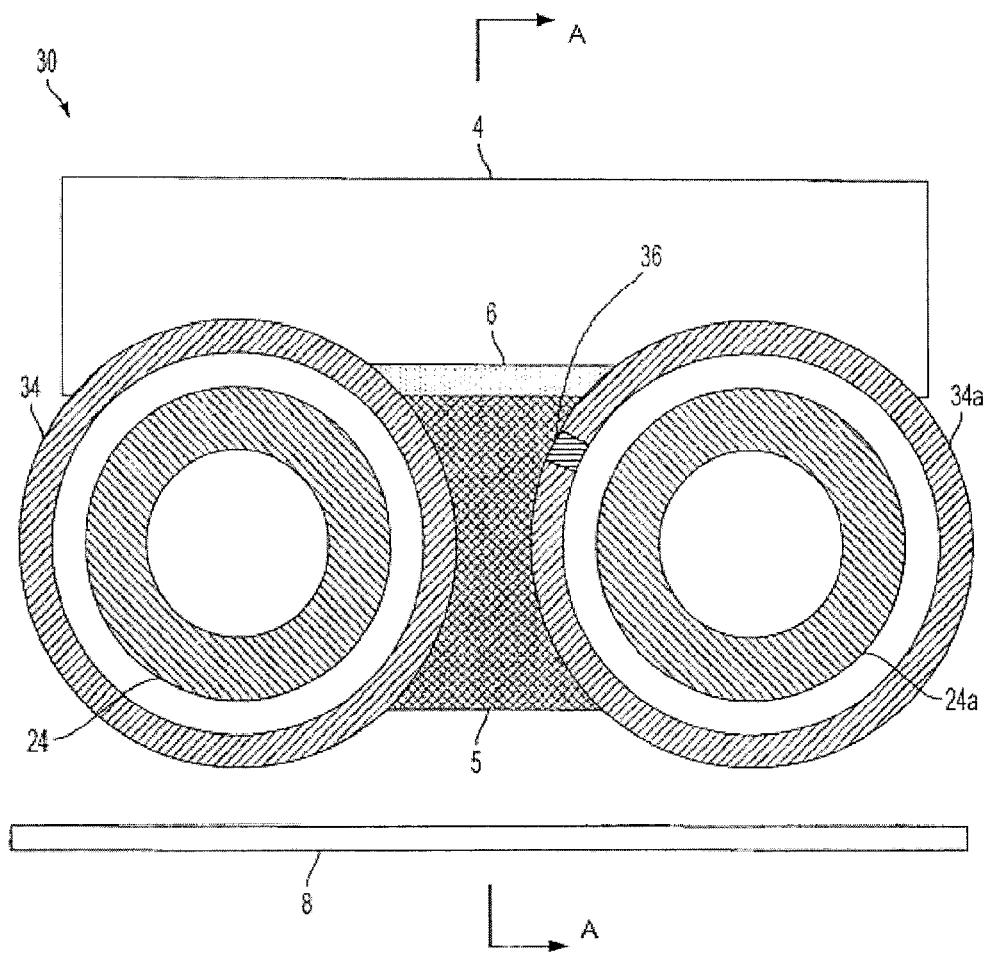
FIG. 1A is a schematic of system including a plasma source.

Referring to FIG. 1, a distributor can be an assembly, which includes a sheath tube 34, such as a ceramic sheath tube for example. In one aspect, a distributor can be an assembly including a sheath tube, a heater and a feed tube. A ceramic sheath tube 34 can sheath a heater 24, such as permeable heater, which in turn, can sheath a feed tube. A sheath tube 34 can include one or more distribution holes 36 configured to provide a semiconductor coating on a substrate 8. A plasma source can include an electrode configured to generate a plasma. A system can also include an additional electrode configured to bias the plasma source with respect to the substrate 8. In certain circumstances, as shown in FIG. 1A, a distributor can include a pair of sheath tubes 34, 34a. In one embodiment, an electrode can be a spacer 5 between a first sheath 34 and a second sheath tube 34a. A spacer 5 can include a graphite cross-rod electrode. A spacer 5 can include a non-metallic material, such as carbon, or other material that is resistant to corrosion. In one embodiment, a spacer 5 can be a graphite spacer. An additional electrode can be a backcap 4 over sheath tubes 34, 34a. A backcap 4 can be a graphite backcap. An insulator 6 can be positioned between the spacer 5 and the graphite backcap 4.

Figure 2:
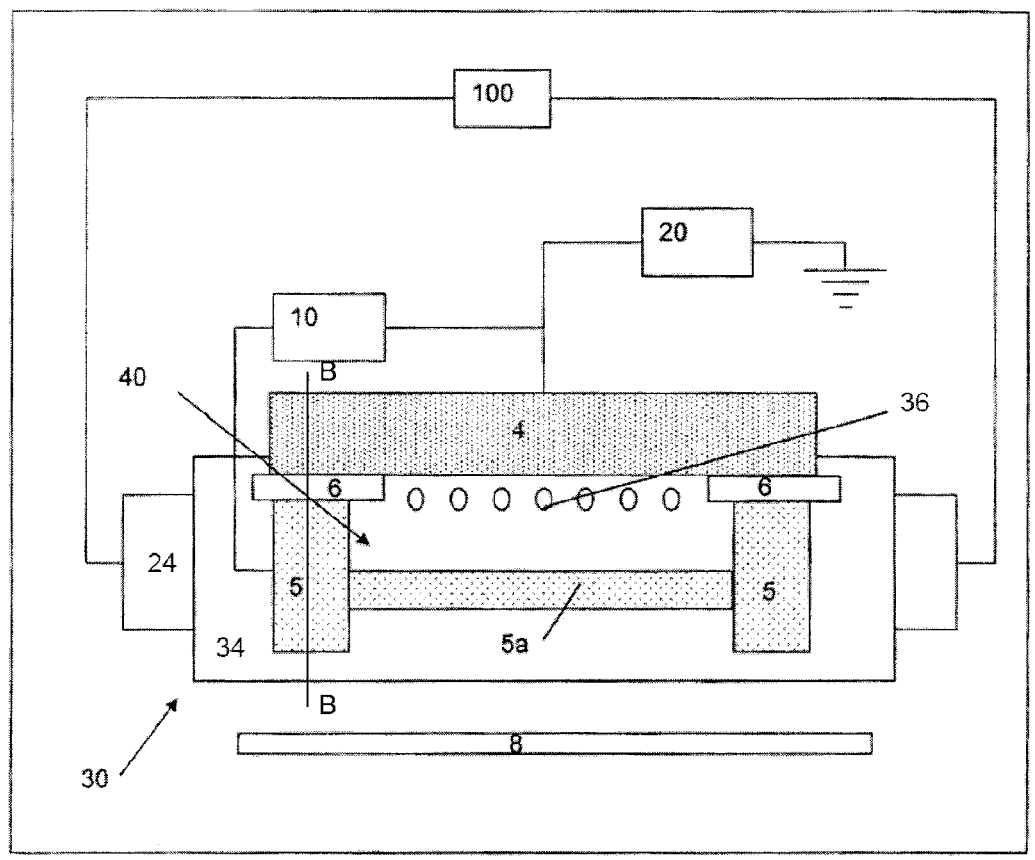
FIG. 2 is a schematic of system including a plasma source.

FIG. 2 is a view taken across the cross-section A-A of FIG. 1A. FIG. 1A is a cross-section view at line B-B of FIG. 2. Referring to FIG. 2, a system can include a distributor power source 100 configured to resistively heat the distributor assembly 30, and a first plasma source 4 (referenced in FIG. 1A as a backcap 4) and a second plasma source 5 (referenced in FIG. 1A as spacer 5) positioned proximate to the distributor assembly and proximate to the substrate 8. Second plasma source can include a graphite cross-rod electrode 5a. In this configuration, a first plasma source 4 and a second plasma source 5 are in parallel. The first or second plasma source 4, 5 can excite a plasma within a volume 40 within a distributor and proximate to the substrate. The plasma source 5 can include an electrode and a power source 10 configured to drive the electrode. The plasma source 4 can further include an additional electrode, and an additional power source 20 configured to bias the plasma with respect to the substrate 8. The distributor can include a sheath tube 34, a permeable heater 24 sheathed by the sheath tube, and a feed tube sheathed by the permeable heater. A distributor can include one or more distribution holes 36 configured to provide a semiconductor coating on a substrate. In one embodiment, an electrode can be a spacer between a first sheath tube and a second sheath tube, or a cross-rod electrode 5a, for example. A spacer can include a non-metallic material, such as carbon. In one embodiment, a spacer can be a graphite spacer. An additional electrode can be a backcap 4 over a first sheath tube and a second sheath tube. A backcap can be a graphite backcap. An insulator 6 can be positioned between the spacer and the graphite back cap.

Figure 3:
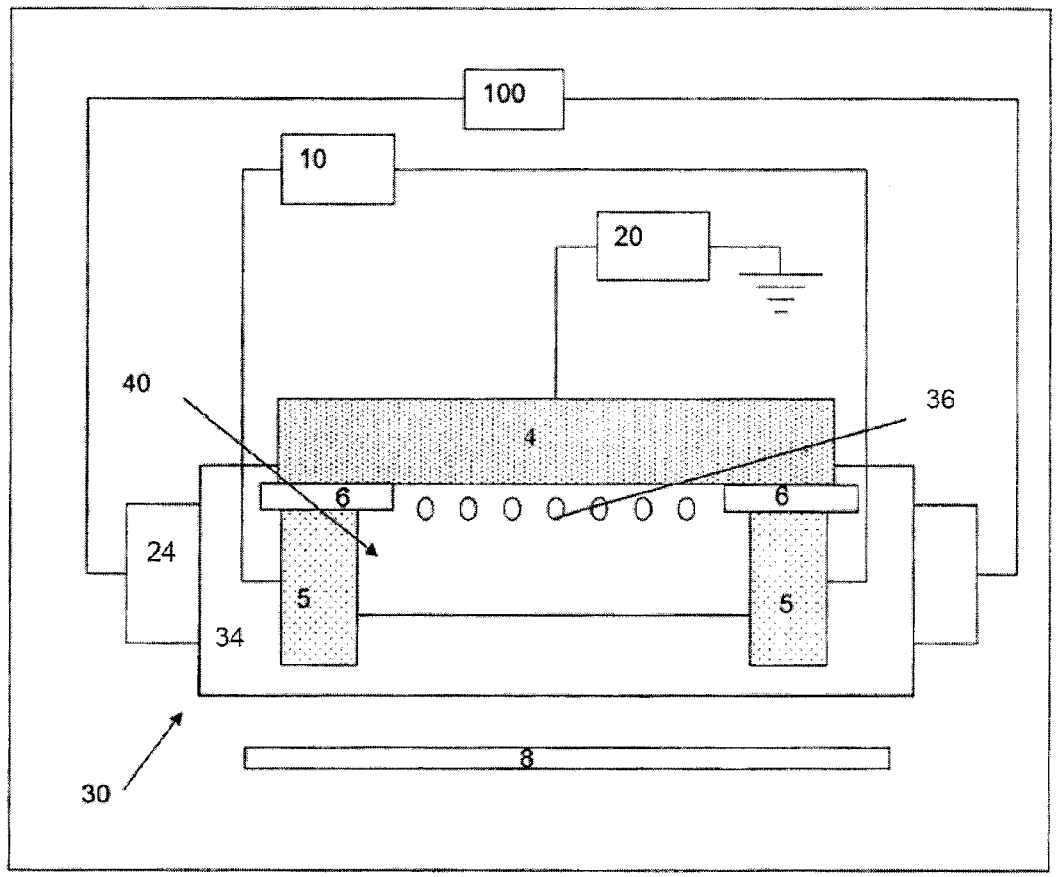
FIG. 3 is a schematic of system including a plasma source.

FIG. 3 is another embodiment showing a system including a distributor power source 100 configured to resistively heat the distributor assembly 30, and a first plasma source 4 and second plasma source 5 positioned proximate to the distributor assembly and proximate to the substrate 8. The first or second plasma source 4, 5 can excite a plasma within a volume 40 within a distributor and proximate to the substrate. The plasma source 5 can include an electrode and a power source 10 configured to drive the electrode. The plasma source 4 can further include an additional electrode, and an additional power source 20 configured to bias the plasma with respect to the substrate 8. The distributor can include a sheath tube 34, a permeable heater 24 sheathed by the sheath tube, and a feed tube sheathed by the permeable heater. A distributor can include one or more distribution holes 36 configured to provide a semiconductor coating on a substrate. In one embodiment, an electrode can be a spacer between a first sheath tube and a second sheath tube, or a cross-rod electrode, for example. A spacer can include a non-metallic material, such as carbon. In one embodiment, a spacer can be a graphite spacer. An additional electrode can be a backcap 4 over a first sheath tube and a second sheath tube. A backcap can be a graphite backcap. An insulator 6 can be positioned between the spacer and the graphite back cap.

Prior methods and systems of depositing a material do not involve intentional plasma processing. The system and method described herein includes exciting a plasma within a volume within a distributor and proximate to the substrate. The plasma can be very useful for adding energy into the deposition source vapor. This added energy can break up dimers such as $Te_2$ or $S_2$ and thereby altering film growth. The monomers Te or S are expected to be more reactive and exhibit different surface mobilities and crystal growth attributes. The plasma can provide charged species to the growing surface that would alter film growth. The plasma could also break up other dimers such as $N_2$, $P_2$, $P_4$, $As_2$, and $Sb_2$ (dopants) whose incorporation in thermal vapor transport deposition tends to be relatively low. Breaking up dopant dimers can greatly enhance incorporation probabilities. The plasma can also supply excited metastable neutrals such as He* or Ar* or O2* that can deliver extra and controllable energy to the growing surface.

Various plasma configurations can be used. For example the plasma source can be driven by direct current (dc), alternating current (ac), pulsed direct current, or radiofrequency (rf) electrical excitation. The electrical power supply is electrically connected to the electrode, wherein the electrode is a component of the plasma source. The electrode configuration could be diode or triode. The plasma could be biased (ac, pulsed dc, or rf) with respect to the substrate which would be a virtual ground. Various geometries of electrodes are possible, and various pressures can be applied. For example, in certain circumstances, a pressure of 0.1-5.0 Torr can be applied.

In some circumstances, a two-tube distributor configuration as shown in FIGS. 1A, 2 and 3, can be quite advantageous for plasma generation. The configuration including a graphite backcap, two mullite tubes and two graphite hourglass end spacers, define five sides of a volume of a distributor assembly containing the deposition vapor with the remaining side an outlet pointed toward the substrate. In this configuration, three graphite components can be electrically isolated from one another and used as electrodes. In this way, the electrodes are completely separated and independent from the power driving the resistive heating of the permeable SiC heater tubes, 24. Because the plasma source is powered independent of the distributor's power source, the plasma source can be operated at any advantageous condition from very weak to highly excited. In certain circumstances, a system can include two power supplies for the plasma sources. A power source can be used to drive the electrode to generate the plasma, while an additional power source can be used to bias the plasma with respect to the substrate. The power source configured to drive the electrode to generate the plasma can be independent of the power source used to drive the distributor assembly. A plasma source can be configured to generate plasma in a region less than 7 centimeters from a substrate. A plasma source can be configured to generate plasma in a region less than 5 centimeters from a substrate. A plasma source can be configured to generate plasma in a region less than 2 centimeters from a substrate.

Various distributor assembly systems and methods for depositing a semiconductor film on a glass substrate are described, for example, in U.S. Pat. No. 5,945,163, U.S. Pat. No. 6,037,241, and U.S. application Ser. No. 11/380,073, the disclosures of which are herein incorporated by reference in its entirety.

In general, a method and system for depositing a semiconductor material on a substrate includes introducing a material and a carrier gas into a distributor assembly having a heated first chamber to form a vapor of the material. The material can be a powder, for example, a powder of a semiconductor material. The carrier gas and vapor are then directed through a series of successive heated chambers to form a uniform vapor/carrier gas composition. The uniformity of the gas composition can be provided by flow and diffusion of the vapor and gas incident to passing the vapor and gas through a plurality of chambers of the distributor assembly. After the composition has become uniform, it is directed out the distributor assembly and towards a substrate, causing a film to be formed on a surface of substrate. The substrate can be a glass substrate or another suitable substrate such as polymer substrate having a surface suitable for forming a uniform film. The film can be a semiconductor composition. The vapor and carrier gas composition may be passed through a filter after being introduced into the distributor assembly in order to ensure that solid particles of that material are not directed toward the substrate. Advantageously, the method and system for depositing a semiconductor material provides a semiconductor film with improved film thickness uniformity and grain structure uniformity.

A deposition system can include a housing defining a processing chamber in which a material is deposited on a substrate. A substrate can be a glass sheet. A housing can include an entry station and an exit station. The housing can be heated in any suitable manner such that its processing chamber can be maintained at a deposition temperature. The distributor temperature can be about 500 degrees to about 1200 degrees C. A substrate can be heated during the processing to a substrate temperature. The substrate temperature can be 200 degrees to 650 degrees C. Substrate 400 can be transported by any appropriate means such as rollers 230, or a conveyor belt, preferably driven by an attached electric motor. Systems and methods for transport are described, for example in U.S. application Ser. Nos. 11/692,667, 11/918,009 and 11/918,010, which are hereby incorporated by reference in their entirety.

A distributor can be an assembly which includes a feed tube and a material supply, which can include a hopper containing a powder and a carrier gas source containing an appropriate carrier gas. Powder can contact carrier gas in the feed tube, and both carrier gas and powder can be introduced into a distributor assembly.

After carrier gas and powder are introduced into the distributor assembly, the powder is vaporized and directed through distributor assembly along with carrier gas in such a manner that carrier gas and the vapor are mixed to form a uniform vapor/carrier gas composition. The uniform vapor/carrier gas composition is then directed out of distributor assembly toward substrate. The lower temperature of a substrate compared to the temperature in a distributor assembly in order to maintain the material in vapor phase, causes condensation of the vapor on a surface of substrate, and the deposition of a film, which has a substantially uniform thickness and a substantially uniform structure demonstrating a uniform crystallization and a substantial absence of particulate material, such as unvaporized powder.

The exit point of the semiconductor vapor from distributor assembly can be spaced from substrate at a distance in the range of about 0.5 to about 5.0 cm to provide more efficient deposition. While greater spacing can be utilized, that may require lower system pressures and would result in material waste due to overspraying. Furthermore, smaller spacing could cause problems due to thermal warpage of substrate during conveyance in the proximity of the higher temperature distributor assembly. A substrate can pass proximate to the point where the semiconductor vapor exits the distributor assembly at a speed of at least about 20 mm per second to about 60 mm per second.

In performing the deposition, successful results have been achieved using cadmium telluride and cadmium sulfide as the material. However, it should be appreciated that other materials can be utilized which include a transition metal (Group IIB) and a chalcogenide (Group VIA). It should be further appreciated that additional materials that can be utilized to form a semiconductor film have many useful applications (such as the manufacture of photovoltaic devices) and may be used with the systems and methods described herein. Also, dopants may be useful to enhance the deposition and properties of the resulting film.

Use of a processing system to perform the method has been performed with a vacuum drawn in the processing chamber 250 to about 0.1 to 760 Torr. The processing system can include a suitable exhaust pump for exhausting the processing chamber of the housing both initially and continuously thereafter to remove the carrier gas.

The carrier gas supplied from the source can be helium, which has been found to increase the glass temperature range and the pressure range that provide film characteristics such as deposition density and good bonding. Alternatively, the carrier gas can be another gas such as nitrogen, neon, argon or krypton, or combinations of these gases. It is also possible for the carrier gas to include an amount of a reactive gas such as oxygen or hydrogen that can advantageously affect growth properties of the material. A flow rate of 0.3 to 10 standard liters per minute of the carrier gas has been determined to be sufficient to provide the material flow to distributor assembly for deposition on a substrate.

It should be recognized that multiple material supplies having multiple hopper and multiple carrier gas sources may introduce carrier gas and material into the distributor assembly. The distributor shown in FIGS. 1 and 2 is shown for the sake of clarity. Alternate embodiments of a material supply can be used. For example, a vibration introduced by a vibratory feeder can cause powder to incrementally move from a hopper into an inclined passage. In this manner, powder is introduced into a feed tube, along with carrier gas from a carrier gas source. Alternatively, a semiconductor film may be deposited on a downward-facing surface of a substrate.

Various embodiments of a distributor assembly are also described below. One embodiment of a distributor assembly is described with reference to its internal components. As described above, a carrier gas and material are introduced into a distributor assembly which can include a tube, which can be formed from mullite. A heater can be formed from graphite or silicon carbide (SiC), and can be resistively heated by applying a current across a heater tube.

A distributor can include a sheath tube, which has a least one distribution hole configured to deposit semiconductor material on a substrate. Distribution holes can have a diameter of about 1 mm to about 5 mm. The number of distribution holes included in distributor assembly can be varied as required, and can be spaced from about 19 mm to about 25 mm apart, for example. The uniform vapor/carrier gas composition can be directed into a nozzle formed by a graphite cradle, after which the vaporized semiconductor is deposited on an underlying substrate, which can be a glass sheet substrate. Directing the uniform vapor/gas composition streams emitted from a distribution hole into a cradle disperses the uniform vapor/gas composition and further increases its uniformity of composition, pressure and velocity in preparation for deposition on underlying substrate. The proximity of a substrate to a nozzle increases the efficiency of depositing the film by reducing the amount of material wasted.

A sheath tube can be formed from mullite. During the passage through a heater tube and into and within the sheath tube, the irregular flow of vapor and carrier gas can result in continuous mixing and diffusion of the vapor components and carrier gas to form a uniform vapor/carrier gas composition. The interior of a sheath tube can also include a thermowell, which can be formed from aluminum oxide and can have an outer diameter of about 5 mm to about 10 mm, for monitoring the temperature of distributor assembly.

The uniform vapor/carrier gas composition can be directed within the interior of a sheath tube or tubular sheath, dispersing the streams of vapor and carrier gas directed from outlets and increasing the uniformity of composition, pressure and velocity of the vapor and carrier gas. The uniform vapor/carrier gas composition can be directed toward a slot or distribution hole, which can be located on a side of sheath tube substantially opposite from the outlets to provide a lengthy and indirect path for the vapor and carrier gas, thereby promoting maximum mixing and uniformity of the vapor/carrier gas composition. The uniform vapor/carrier gas composition can be directed out of outer sheath tube through a distribution hole and can be deposited on a surface of underlying substrate.

An alternative embodiment of a distributor assembly includes a permeable heater. A powder and a carrier gas are introduced into a permeable heater or a heated tube, which is heated resistively. The resistive electrical path can be provided by a tubular center electrode, which can be formed from graphite. A heated tube can be permeable and made from SiC. Also contained within the interior of a heated tube can be a thermowell for monitoring the temperature of a heated tube.

The heat provided from a resistively heated tube causes the powder to vaporize inside heated tube, after which the resulting vapor and carrier gas permeate the walls of heated tube and are directed to the interior of surrounding sheath tube, which can be composed of mullite. The powder that is not vaporized does not permeate the walls of heated tube. A surrounding sleeve can be oriented inside a larger-diameter outer sheath tube, with portions of a tubular center electrode separating surrounding sleeve from outer sheath tube, which, like surrounding sleeve can be made from mullite. The vapor and carrier gas can be prevented from escaping the interior of surrounding sleeve by a stopper sleeve, which can be made of ceramic tape packing. The vapor and carrier gas can be directed into a passageway formed in a tubular center electrode. As the vapor and carrier gas travel through distributor assembly, and passageway in particular, the irregular flow pattern causes the vapor and carrier gas to mix and diffuse into a substantially uniform vapor/carrier gas composition.

After the vapor/carrier gas uniform composition is directed into a heated tube, it can travel within and along a heated tube, continuously remixing the vapor/carrier gas composition. The uniform vapor/carrier gas composition is directed out of the heated tube into the interior of sheath tube through a plurality of outlets, which can be holes drilled in a line along a portion of the length of one side of the heated tube. As with previous embodiments, after traveling through outlets, the vapor/carrier gas composition is directed within the sheath tube, dispersing the streams of vapor/carrier gas composition directed through outlets and further promoting vapor/carrier gas uniformity of composition, pressure and velocity. The vapor/carrier gas composition is then directed toward a slot or distribution hole, which is preferably provided on a side of outer tubular sheath substantially opposite outlets to maximize the path length of the vapor/carrier gas composition and resulting uniformity thereof. Finally, the substantially uniform vapor/carrier gas composition is directed out a slot or distribution hole (which can be provided along the entire length of outer tubular sheath) toward underlying substrate so that a film may be deposited thereon.

In another embodiment, powder and carrier gas can first be directed into a filter tube positioned inside a heater or heater tube. The heater tube heats a filter tube to a temperature sufficient to vaporize the powder inside filter tube. The filter tube can also be resistively heated and can be permeable to the vapor, so the vapor and carrier gas permeate filter tube and are directed into heater tube. A filter tube can be formed from SiC.

As vapor and carrier gas permeate into the heater tube from the filter tube, the mixed vapor and carrier gas are directed out of the heater tube through an outlet, which can be a single hole or opening located near one end of heater tube, and which can have a diameter of about 10 mm to about 15 mm, for example. The vapor and carrier gas can be directed through an outlet, which causes the vapor and carrier gas to continue to mix while entering the interior of a manifold, which can be formed from graphite, and which can have an outer diameter of about 75 mm to about 100 mm (preferably about 86 mm), and an inner diameter of about 60 mm to about 80 mm (preferably about 70 mm). The flow of the vapor and carrier gas within the manifold causes the vapor and carrier gas to continue to mix and form a uniform vapor/carrier gas composition. The vapor and carrier gas can be directed from an outlet on one side of heater tube around heating tube inside the manifold to a plurality of distribution holes positioned in a line along the length of manifold on a side of a manifold substantially opposite the side of heater tube where drilled hole is located. A thermowell can also be provided proximate to heater tube in order to monitor the temperature of distributor assembly.

In another embodiment, an additional feed tube and material source may be provided at an opposite end of distributor assembly.

In an alternate embodiment, a powder and a carrier gas are directed into the interior of first heater tube via a feed tube. The first heater tube can be resistively heated to a temperature sufficient to vaporize the powder and is permeable to the resulting vapor and the carrier gas, but impermeable to the powder. Consequently, any powder that is not vaporized is unable to pass from the interior of first heater tube. The first heater tube can be formed from SiC.

After the powder is vaporized to form a vapor, the vapor and carrier gas permeate the walls of first heater tube and are directed to the space between first heater tube and first tubular sheath, which can be formed from mullite, graphite, or cast ceramic. Passage within a tubular sheath causes the vapor and carrier gas to mix to form a uniform vapor/carrier gas composition. The uniform vapor/carrier gas composition is directed through a space formed in the tubular sheath toward an underlying substrate onto which the vapor is deposited as a film.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A deposition system comprising:
a distributor configured to vaporize a semiconductor material and direct the vaporized semiconductor material through at least one distribution hole in the distributor for deposition on a substrate, the distributor configuration including a five-sided volume, two sides of said volume being defined by a pair of tubes, two sides of said volume being defined by spacers each of which has an hour glass-shape, and a backcap, the distributor volume having an outlet across from said backcap and toward the substrate;
a first electrical power supply configured to heat the distributor; and
a plasma source having an electrode configured to generate a plasma, wherein the electrode is driven by a second electrical power supply electrically independent from the first electrical power supply and the plasma source is positioned between the at least one distribution hole in the distributor and the substrate to expose the vaporized semiconductor material to a plasma prior to deposition on the substrate.

2. The system of claim 1, further comprising an additional electrode configured to bias the plasma source with respect to the substrate.

3. The system of claim 1, wherein the electrode includes a non-metallic material.

4. The system of claim 1, wherein the electrode includes carbon.

5. The system of claim 1, further comprising an additional electrode wherein the additional electrode comprises the backcap.

6. The system of claim 5, wherein the backcap comprises graphite.

7. The system of claim 1, wherein the pair of tubes includes a first sheath tube and a second sheath tube.

8. The system of claim 7, wherein the electrode comprises one of the hour glass-shaped spacers between the first sheath tube and the second sheath tube.

9. The system of claim 8, wherein the spacers comprises graphite.

10. The system of claim 7, further comprising an additional electrode wherein the additional electrode comprises the backcap.

11. The system of claim 1, wherein the pair of tubes includes a first sheath tube and a second sheath tube, and the plasma source includes three graphite components electrically isolated from one another.

12. The system of claim 11, wherein the first graphite component is a first spacer separating the first sheath tube from the second sheath tube, the second graphite component is a second spacer separating the first sheath tube from the second sheath tube, and the third graphite component is the backcap over the first sheath tube and the second sheath tube.

13. The system of claim 12, further comprising an insulator between the backcap and each of the spacers.

14. The system of claim 1, wherein the distributor includes a plurality of distribution holes configured to provide a semiconductor coating on the substrate.

15. The system of claim 1, wherein the plasma source is driven by direct current.

16. The system of claim 1, wherein the electrode is driven by alternating current.

17. The system of claim 1, wherein the plasma source is driven by pulsed direct current.

18. The system of claim 1, wherein the plasma source is driven by radiofrequency electrical excitation.

19. The system of claim 1, further comprising a conveyor configured to transport the substrate past the distributor.

20. The system of claim 1, wherein the distributor is positioned within a deposition chamber, the deposition chamber including an entry through which substrates to be coated are introduced into the deposition chamber; and the deposition chamber including an exit through which coated substrates leave the deposition chamber.

21. The system of claim 1, wherein the distributor includes a ceramic tube.

22. The system of claim 1, wherein the pair of tubes includes mullite.

23. The system of claim 1, wherein each tube is a ceramic sheath tube.

24. The system of claim 1, further comprising a permeable heater positioned within the distributor.

25. The system of claim 1 wherein the plasma source is configured to generate plasma in a region less than 10 centimeters from the substrate.

26. The system of claim 1, wherein the plasma source is configured to generate plasma in a region less than 7 centimeters from the substrate.

27. The system of claim 1, wherein the plasma source is configured to generate plasma in a region less than 5 centimeters from the substrate.

28. The system of claim 1, wherein the plasma source is configured to generate plasma in a region less than 2 centimeters from the substrate.

* * * * *